United States Patent
Strack

[19]

[11] Patent Number: 6,072,220
[45] Date of Patent: Jun. 6, 2000

[54] INTEGRATED RESISTOR

[75] Inventor: Helmut Strack, Munich, Germany

[73] Assignee: Siemens Aktiengesellschaft, Munich, Germany

[21] Appl. No.: 09/206,577

[22] Filed: Dec. 7, 1998

Related U.S. Application Data

[62] Division of application No. 08/607,399, Feb. 27, 1996, abandoned.

[30] Foreign Application Priority Data

Mar. 6, 1995 [DE] Germany .......................... 195 07 802

[51] Int. Cl.[7] ..................................................... H01L 27/02
[52] U.S. Cl. ........................... 257/379; 257/536; 257/904
[58] Field of Search ..................................... 257/379–381, 257/536–538; 438/238, 381–384

[56] References Cited

U.S. PATENT DOCUMENTS

| | | |
|---|---|---|
| 4,057,894 | 11/1977 | Khajezadeh et al. . |
| 4,100,565 | 7/1978 | Khajezadeh et al. . |
| 5,134,088 | 7/1992 | Zetterlund . |
| 5,212,542 | 5/1993 | Okumura . |
| 5,439,841 | 8/1995 | Alter . |
| 5,489,547 | 2/1996 | Erdeljac et al. . |
| 5,618,749 | 4/1997 | Takahashi et al. ....................... 438/384 |

OTHER PUBLICATIONS

Yamauchi, "A Process for a CMOS Channel–Stop Implantation Self–Aligned to the p–Well and p–Well Active Area", IEEE Transactions on Electron Devices, vol. ED–34, No. 12, Dec. 1987, pp. 2562–2563.

*Primary Examiner*—Jey Tsai
*Attorney, Agent, or Firm*—Hill & Simpson

[57] ABSTRACT

A semiconductor body includes a lightly doped semiconductor zone of a second conductivity type. A first oxide layer is produced on the semiconductor body. A structured polysilicon layer is produced on the oxide layer. The polysilicon layer acts as a mask so that the dopants of one conductivity type are implanted and driven into the surface of the semiconductor zone. A second oxide layer is then produced on the surface of the polysilicon layer and the semiconductor zone. A spacer is etched from this oxide layer. Dopants of the second conductivity type are implanted and driven into the surface of the semiconductor zone. A narrow resistor zone remains lying under the polysilicon layer.

6 Claims, 1 Drawing Sheet

INTEGRATED RESISTOR

This is a divisional of application Ser. No. 08/607,399, filed Feb. 27, 1996, abandoned.

BACKGROUND OF THE INVENTION

1. Field of the Invention

The invention is directed to a method for manufacturing a resistor integrated into a semiconductor body as well as to a product produced by such a method. The invention uses a mask to introduce dopants of one conductivity type into a semiconductor zone of a second conductivity type.

2. Description of the Prior Art

Similar methods have been employed in integrated circuits. High values of resistance occur by low doping, small width and great length of the semiconductor zone serving as the resistor. The length of the zone can be reduced by lowering the doping and reducing the width of the semiconductor zone. Since the doping of the semiconductor zone cannot be lower than the doping of the semiconductor body or the doping of the diffusion well into which the resistor is to be integrated, the length should be kept short for space reasons. Therefore, only the width of the resistor zone remains as a variable.

SUMMARY OF THE INVENTION

An object of the invention is to specify a manufacturing method for an integrated resistor in a manner which permits extremely narrow resistors to be produced in a simple way.

This object is achieved by producing a layer of oxide on the semiconductor body. A structured polysilicon layer is produced onto the layer of oxide. This polysilicon layer acts as a mask so that the dopants of one conductivity type are implanted and driven into the surface of the semiconductor zone.

Another oxide layer is produced on the surface of the polysilicon layer and on the surface of the semiconductor zone. A spacer is then etched from this oxide layer.

After the spacer is in place, dopants of the second conductivity type are implanted and driven into the surface of the semiconductor zone. A narrow resistor zone is formed under the polysilicon layer.

The invention is explained in greater detail with reference to two exemplary embodiments in conjunction with FIGS. 1 through 3.

DETAILED DESCRIPTION OF THE PREFERRED EMBODIMENTS

Figure 1:
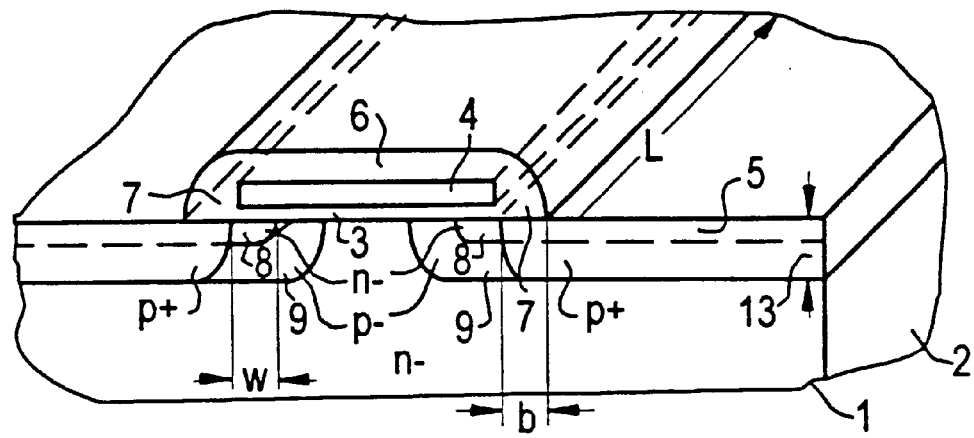
FIG. 1 is a sectional view of a preferred embodiment.

The semiconductor body 1 of an integrated circuit is shown in FIG. 1. The semiconductor body 1 has a lightly n-doped zone 2 that is formed by an epitaxial layer and arranged on a substrate (not shown). Lightly p-doped wells 9 are embedded in the zone 2. These are produced by a masked diffusion in a known manner. In the manufacture of the integrated resistor, the upper surface of the semiconductor body 1 is covered with an oxide layer 3. A polysilicon layer 4 is then deposited on the oxide layer 3. Subsequently, the polysilicon layer 4 and the oxide layer 3 are etched and structured so that they overlap the wells 9. A lightly n-doped layer 5 is implanted in the surface of the semiconductor body 1. The depth of the n-doped layer 5 is symbolized by the broken line. The resultant structured polysilicon layer 4 acts as a mask. Subsequently, the layer 5 is driven in and forward under the polysilicon layer 4. Next, a further oxide layer 6 is deposited on the surface of the polysilicon layer 4 and the surface of the layer 5. This oxide layer 6 is then etched such that a spacer 7 of width b remains at the edge of the polysilicon layer 4. The manufacture of such spacers is known from CMOS technology and is therefore not separately explained herein.

After the manufacture of the spacer 7, a high dose of p-type dopants are implanted and driven into the surface of the semiconductor body 1. A highly p-doped layer 13 thus arises. This highly p-doped layer 13 must be at least as thick as the n-doped layer 5.

Figure 2:
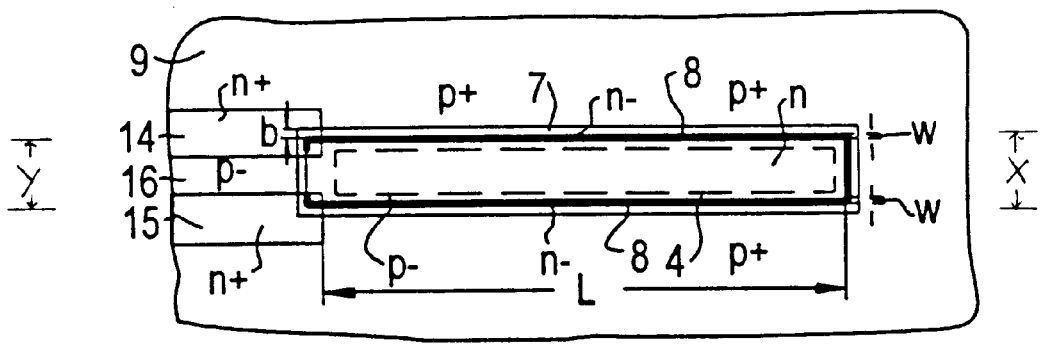
FIG. 2 is a plan view of the preferred embodiment in FIG. 1.

FIG. 2 shows the part of the lightly n-doped zone 5 that has not been re-doped and is referenced as resistor zone 8. Implementing the spacer 7 permits zone 8 to be manufactured in a width W. The width of the resistor zone 8 under the polysilicon layer 4 is dependent on the drive-in temperature with which the zone 5 is produced and on the duration of the diffusion. The length L of zone 8 is determined by the integral net doping of zone 8, for example a length L of $10^{12}$ through $10^{13}$ cm$^{-2}$, a width W of 0.5 µm, and a resistance of 1–10 KOhm/µm. The spacer 7 prohibits the high p-doping of zone 13 from intermingling with the n$^-$-doping of zone 8 in the diffusion process.

FIG. 2 illustrates a resistor zone 8 that is formed by the n$^-$-doping at the two long sides L of zone 8 and by the n$^-$-doping at the right-hand narrow side X of zone 8. The resistor zone 8 is contacted at the left side by two highly n-doped implanted zones 14 and 15 that are separated from one another. At the left-hand narrow side Y, the n$^-$-doped zone 8 is parted by a lightly p-doped zone 16. Zone 16 is driven in by a mask before the application of the oxide layer 6.

Figure 3:
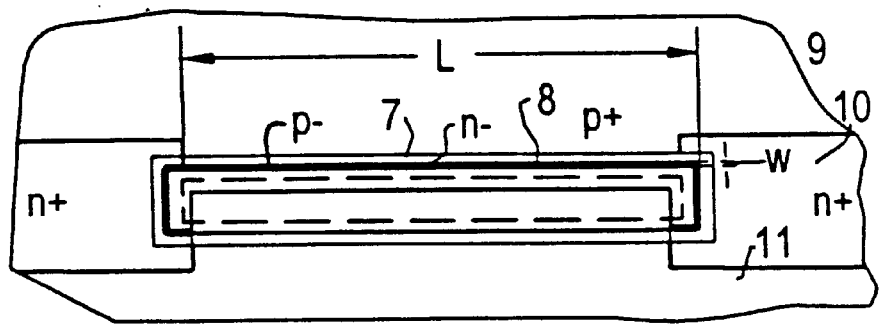
FIG. 3 is a plan view of an alternative preferred embodiment.

FIG. 3 shows the structured polysilicon layer 4 covered at one side by an additional thick oxide layer 11 (and thus the layer 4 is not visible in FIG. 3) producing a resistor zone 8 composed of a straight stripe. The spacer 7 is produced only at that side of the polysilicon layer 4 that is not covered by the oxide layer 11. The resistor zone 8 is contacted by a highly n-doped zone 10 at both the left and right sides. Instead of being fashioned stripe-shaped, the integrated resistor can also be fashioned serpentine-shaped.

The invention has the advantage that the integrated resistors can be manufactured in a technology known for the manufacture of depletion MOSFETs. Here, the structured polysilicon layer 4, which serves as the gate electrode in a depletion MOSFET, electrically shields the resistor zones 8 against electrical charges present on the surface of the oxide layer 6. Of course, the invention can also be used for semiconductors having inverse conductivity types.

Although modifications and changes may be suggested by those skilled in the art, it is the intention of the inventors to embody within the patent warranted hereon all changes and modifications as reasonably and properly come within the scope of their contribution to the art.

What is claimed is:

1. A resistor integrated into a semiconductor body comprising:

a semiconductor body having a lightly doped semiconductor zone of a second conductivity type;

a first oxide layer on the semiconductor body;

a structured polysilicon layer on the first oxide layer;

dopants of a first conductivity type implanted and driven into a surface of the semiconductor zone;

a second oxide layer on a surface of the polysilicon layer and the surface of the semiconductor zone;

a spacer etched from the second oxide layer;

the dopants of the second conductivity type implanted and driven into the surface of the semiconductor zone in regions defined at least in part by said spacer; and a narrow resistor zone remaining under the polysilicon layer.

2. The resistor in claim 1 wherein the semiconductor body of the first conductivity type encompasses the semiconductor zone of the second conductivity type.

3. The resistor in claim 1 wherein a concentration of said dopants of the second conductivity type exceeds a concentration of said dopants of the first conductivity type.

4. The resistor in claim 1 comprising highly doped zones of the first conductivity type implanted in said surface of the semiconductor zone and wherein said resistor contacts the highly doped zones of the first conductivity type.

5. The resistor in claim 1 wherein the resistor is stripe-shaped.

6. The resistor in claim 1 wherein the resistor is serpentine shaped.

* * * * *